United States Patent
Heima

(10) Patent No.: US 6,894,598 B2
(45) Date of Patent: May 17, 2005

(54) INDUCTOR HAVING SMALL ENERGY LOSS

(75) Inventor: Tetsuya Heima, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 17 days.

(21) Appl. No.: 10/614,610

(22) Filed: Jul. 8, 2003

(65) Prior Publication Data

US 2004/0140878 A1 Jul. 22, 2004

(30) Foreign Application Priority Data

Jan. 17, 2003 (JP) ........................................ 2003-009815

(51) Int. Cl.⁷ .............................................. H01M 5/00
(52) U.S. Cl. ........................ 336/200; 336/223; 336/232
(58) Field of Search ................... 336/200, 223, 336/232, 186; 257/528, 531, 532; 455/318, 319, 323, 333

(56) References Cited

U.S. PATENT DOCUMENTS 6,194,987 B1 2/2001 Zhou et al.
6,529,720 B1 3/2003 Jovenin et al.

Primary Examiner—Lincoln Donovan
Assistant Examiner—Jennifer A. Poker
(74) Attorney, Agent, or Firm—Leydig, Voit & Mayer, Ltd.

(57) ABSTRACT

An inductor has a laminated structure in which an insulating layer and a wiring layer are laminated alternately on a semiconductor substrate. The laminated structure includes at least two wiring layers and an insulating layer interposed between them. A first wiring layer has a first winding part and a second winding part in the same plane, adjacent each other, and wound. A second wiring layer has a wiring part having a single path from one terminal to the other. The first and second winding parts are electrically connected to the wiring part. When a voltage is applied between one terminal of the first winding part and one terminal of the second winding part, currents flow in the first and second winding parts in opposite directions.

9 Claims, 7 Drawing Sheets

INDUCTOR HAVING SMALL ENERGY LOSS

BACKGROUND OF THE INVENTION

1. Field of the Invention

The present invention relates to an inductor whose energy loss is small.

2. Description of the Background Art

A small and high-density integrated monolithic microwave integrated circuit (MMIC) has attracted attention as a high-frequency circuit used for mobile communication, satellite communication or the like. This is a microwave integrated circuit of a multi-layer structure in which an active device (a field effect transistor (FET), a high electron mobility transistor (HEMT) or the like) and a passive device (a transmission line, a capacitor, an inductor or the like) are mounted together on a semiconductor substrate. In recent years, the high-frequency circuit has been fabricated with complementary metal-oxide semiconductor (CMOS) circuitry. In this MMIC, a spiral inductor is often used as an inductor. The spiral inductor has a spiral, electrically conductive pattern wound in a plane. At least one of the outside and inside terminals of the conductive pattern is electrically connected to an electrode on another wiring layer through a via hole or a through hole. The spiral inductor has an advantage that the number of wiring layers necessary for forming the inductor is reduced.

When a voltage is applied between the outside and inside terminals of the spiral inductor, a spiral current flows in the conductive pattern to induce magnetic field around the inductor. Particularly, at the central portion of the spiral, a magnetic flux is generated which penetrates the plane of the conductive pattern. This magnetic flux enters the semiconductor substrate (non-insulating substrate). Now, when the magnetic flux is changed in accordance with the current flowing through the spiral conductive pattern an, eddy current is generated in the substrate by electromagnetic induction. Since this eddy current is generated in the direction opposing the magnetic flux, the magnetic flux density is reduced. As a result, self-inductance (L) of the spiral inductor is reduced and the quality factor (Q) is lowered. In a word, energy loss is large in the conventional spiral inductor. In addition, energy loss is large in an integrated circuit including such a spiral inductor as a whole since energy loss in the spiral inductor is large.

According to the conventional spiral inductor, in order to improve the Q value, two windings (two spiral inductors) are arranged opposed to each other (refer to Japanese Patent Laid-Open Publication No.2000-208704, for example). The two windings are connected in parallel. The winding directions of the two windings are symmetric and opposite to each other. According to the two windings, in the case where the current flows through the two windings, the mutual inductance can be reduced and the Q value can be high.

Furthermore, there is an inductance device in which a high Q value can be obtained by connecting two loops in parallel to reduce a whole resistance value (refer to Japanese Patent Laid-Open Publication No. 2002-508592, for example).

Still further, the high Q value can be obtained by removing four corners of a spiral coil wound around in a rectangular form (refer to Japanese Patent Laid-Open Publication No 3-89543, for example).

However, an inductor described in JP Laid-Open Publication No.2000-208704 is only applicable to the circuit employing the same two spiral inductors even though a high-frequency circuit uses only one spiral inductor instead of two in many cases.

In addition, the inductor described in JP Laid-Open Publication No.2000-208704 occupies a large area. Since the area of spiral inductor is thousands and ten thousands times as large as that of another device, if two spiral inductors are used, the area occupied by the spiral inductors is extremely increased.

Furthermore, it is not referred to at all in JP Laid-Open Publications No. 2000-208704, No. 2002-508592 and No. 3-89543 that the Q value is reduced because the magnetic flux induced by the current flowing in the inductor enters the semiconductor substrate.

SUMMARY OF THE INVENTION

It is an object of the present invention to provide an inductor in which the Q value is high and energy loss is small.

It is a further object of the present invention to provide an inductor which prevents a magnetic flux induced by the current flowing therein from entering a substrate.

According to a first aspect of the present invention, an inductor comprising a laminated structure in which an insulating layer and a wiring layer are layered alternately on a semiconductor substrate, wherein said laminated structure comprises a first layer structure, a second layer structure and a first insulating layer interposed between them, said first layer structure comprising a first wiring layer on which a first winding part and a second winding part wound around on the same plane are disposed adjacently to each other, said second layer structure comprising a second wiring layer on which a first wiring part is disposed having a single path from one terminal thereof to the other terminal thereof, said first insulating layer comprising a first via hole and a second via hole connecting said first wiring layer to said second wiring layer, wherein a first terminal of said first winding part is connected to a second terminal of said first wiring part through said first via hole and a third terminal of said second winding part is connected to a fourth terminal of said first wiring part through said second via hole, and whereby a current flows around said first winding part from a fifth terminal thereof to said first terminal thereof and a current flows around said second winding part from said third terminal thereof to a sixth terminal thereof, with the directions of those currents being opposite to each other when a voltage is applied between said fifth terminal of said first winding part and said sixth terminal of said second winding part.

The inductor according to the present invention has an advantage of preventing the magnetic flux generated by the current flowing in it from entering the substrate in a region surrounded by the inductor, which increases the Q value of the inductor and reduces the energy loss thereof.

Additional objects and advantages of the present invention will be apparent from the following detailed description of preferred embodiments thereof, which are best understood with reference to the accompanying drawings.

DESCRIPTION OF THE PREFERRED EMBODIMENTS

The following description is a detailed description of the main embodiments of the invention, with reference to the drawings in which the same numerical references identify the same elements in each of the different figures.
(First Embodiment)

Figure 1A:
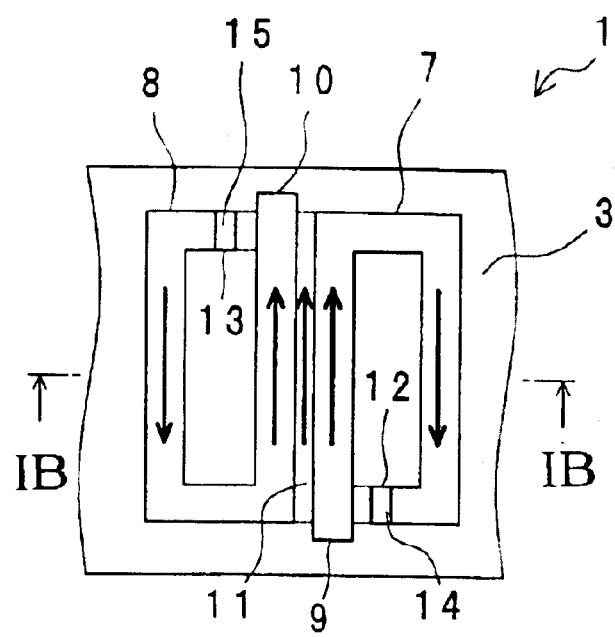
FIG. 1A is a plan view of a spiral inductor according to a first embodiment of the present invention.
Figure 1B:
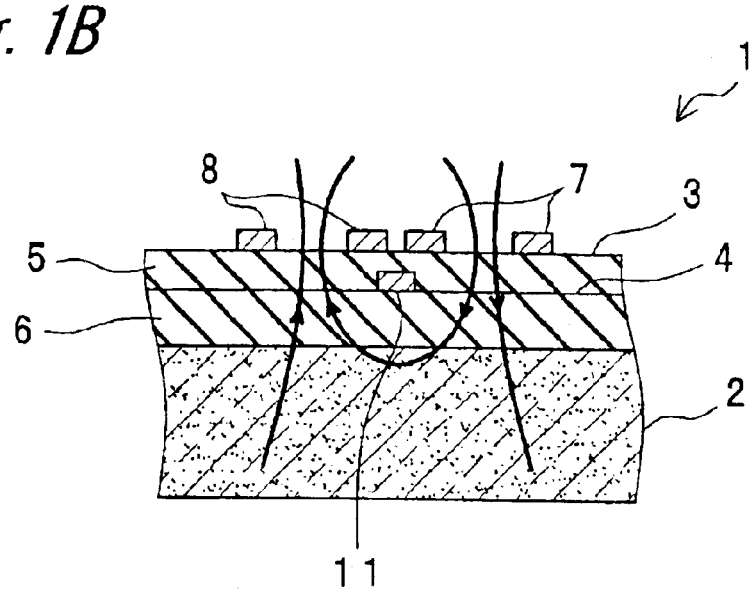
FIG. 1B is a sectional view of the spiral inductor.

FIGS. 1A and 1B show a spiral inductor according to the first embodiment of the present invention, in which FIG. 1A is a plan view of the spiral inductor, and FIG. 1B is a sectional view taken along line IB—IB in FIG. 1A. The spiral inductor 1 has a laminated structure in which a wiring layer and an insulating layer are layered alternately on a semiconductor substrate 2. Referring to FIG. 1B, the laminated structure has wiring layers 3 and 4, an insulating layer 5 interposed between them and an insulating layer 6 interposed between the wiring layer 4 and the semiconductor substrate 2. More specifically, the insulating layer 6, the wiring layer 4, the insulating layer 5 and the wiring layer 3 are layered on the semiconductor substrate 2 in this order. Each of the wiring layers in the spiral inductor 1 has an electrically conductive pattern made of aluminum (Al), copper (Cu) or the like. As shown in FIG. 1A, the spiral inductor 1 includes first and second winding parts 7 and 8. The first and second winding parts 7 and 8 are wound around on a single plane on the wiring layer 3 which is the uppermost layer of the laminated structure. Here, each of the first and second winding parts 7 and 8 has a shape wound around spirally from outside to inside only once. In addition, the spiral winding consists of straight-lines connected to each other at right angles like a rectangle. The first and second winding parts 7 and 8 have the same shape.

As shown in FIG. 1A, the first and second winding parts 7 and 8 are arranged adjacently to each other. Here, if the straight-line part from a starting point (an outside terminal 9 of the winding part 7) to the first corner along the winding direction of the first winding part 7 is referred to as the first straight-line part, and the counterpart from a starting point (an outside terminal 10 of the winding part 8) to the first corner along the winding direction of the second winding part 8 is referred to as the second straight-line part, the first and second winding parts 7 and 8 are disposed in such a way that the first and second straight-line parts are in parallel and opposed to each other. In addition, they are arranged in such a way that their winding directions from the outside terminal to the inside one are symmetrical but opposite to each other. As a result, they are symmetric to each other with respect to a point on the wiring layer 3.

A wiring part 11 having a single path from one terminal to the other is provided on the wiring layer 4 of the spiral inductor 1. The one terminal of the wiring part 11 is electrically connected to an inside terminal 12 of the first winding part 7 on the wiring layer 3 by a via hole 14 piercing through the insulating layer 5, while the other one of the wiring part 11 is electrically connected to an inside terminal 13 of the second winding part 8 by another via hole 15 piecing through the insulating layer 5. More specifically, the wiring part 11 are provided on the wiring layer other than the wiring layer on which the first and second winding parts 7 and 8 are provided, electrically connecting the first and second winding parts 7 and 8. The wiring part 11 may have any shape if it can electrically connect the two winding parts 7 and 8, but it preferably has the following shape. The wiring part 11 of the spiral inductor 1 has a straight-line part (referred to as the third straight-line part hereinafter). The third straight-line part is positioned on the wiring layer 4 so as to be in parallel with the first and second straight-line parts and to be opposed to a region between the first and second straight-line parts on the wiring layer 3. As for the wiring part 11, the portion extending from the terminal connected to the first winding part 7 to the third straight-line is opposed to the first winding part 7 and arranged along the winding direction of the first winding parts 7, while the another portion extending from the terminal connected to the second winding part 8 to the third straight-line part is opposed to the second winding part 8 and arranged along the winding direction of the second winding part 8. In addition, the form of the wiring part 11 is symmetric with respect to its central point. Furthermore, as shown in FIG. 1A, when the first and second winding parts 7 and 8 and the wiring part 11 are disposed as described above, they form a symmetric pattern with respect to its central point when viewed from the above.

Hereinafter, an operation of the above-mentioned spiral inductor 1 will be described. The one (outside) terminal 9 of the first winding part 7 and the one (outside) terminal 10 of the second winding part 8 are connected to outside devices or circuits, for example, by extending the terminals through via holes. When a voltage is applied between the terminal 9 and 10, a current flows in the spiral inductor 1. Arrows in FIG. 1A show the directions of the current flowing in the spiral inductor 1 when the current flows from the terminal 9 to the terminal 10. The current flows from the outside terminal 9 to the inside one 12 in the first winding part 7. Then it reaches the wiring part 11 on the wiring layer 4 through the via hole 14. After the current flows through the wiring part 11, it returns to the wiring layer 3 through the via hole 15. Then the current flows from the inside terminal 13 to the outside terminal 10 in the second winding part 8. As shown in FIG. 1A, the direction of the current flowing in the first winding part 7 and that of the current flowing in the second winding part 8 are clockwise and counterclockwise, respectively, and opposite to each other.

Arrows shown in FIG. 1B show the directions of the magnetic flux generated by the current flowing in the directions shown by the arrows in FIG. 1A. The magnetic flux in the first winding part 7 is generated in the direction of coming in the semiconductor substrate 2 from above by the current. And the magnetic flux in the second winding part 8 is generated in the direction of going out of the semiconductor substrate 2 by the current. As shown in FIG. 1B, the magnetic flux penetrates the first winding part 7 from top down (in the direction of coming in the substrate 2), passes under the wiring part 11 and penetrates the second winding part 8 from bottom up (in the direction of going out of the substrate 2) Thus, the magnetic flux entering the substrate 2 can be reduced and eddy current can be prevented from generating in a region surrounded by the winding parts of the spiral inductor. As a result, energy loss of the spiral inductor 1 can be reduced.

The spiral inductor according to this embodiment of the present invention itself can prevent the magnetic flux generated by the current flowing in the inductor from entering the substrate without employing any other device. Then, it is easy to optimize the spiral inductor, and it is not necessary to optimize it many times every use. Therefore, the same advantage can be achieved whoever uses it. That is, a versatile inductor can be realized according to the spiral inductor of this embodiment. Furthermore, the spiral inductor according to this embodiment of the present invention can be provided as a module of the inductor having high reusability, in a library.

Moreover, according to the inductor of this embodiment of the present invention, the magnetic flux can be prevented from entering the substrate with a relatively simple structure. Still further, since the spiral inductor has the shape such that one inductor seems to be divided into two, the device having extremely high symmetric property can be realized as compared with a conventional spiral inductor.

In addition, although the winding part are wound around from the outside to the inside only once in the shape of a rectangle in the spiral inductor according to this embodiment of the present invention, it is to be noted that the shape is not limited to this. The winding part may be wound around in the shape of a circle, for example. In addition, the number of turns may be two or more. Furthermore, the winding parts disposed adjacently to each other may have any shapes, respectively so long as the current which flow around them are in the opposite directions to each other. Even in that case, the same advantage can be obtained as in the spiral inductor according to this embodiment.

Furthermore, although the two winding parts are arranged side by side in the spiral inductor according to this embodiment of the present invention, it is to be noted that the arrangement is not limited to this. It is all right so long as the two winding parts are closely arranged in such a way that the currents flowing in them are in the opposite directions to each other. In that case, the same advantage can be obtained as in the spiral inductor according to this embodiment.

Furthermore, although the two winding parts have the same shapes in the spiral inductor according to this embodiment, it is to be noted that the shapes are not limited to be so. Even if they have different shapes, the magnetic flux can be prevented from entering the substrate. However, if the two winding parts have the same shapes, the paths of the currents flowing around the winding parts become symmetric (the directions of the currents are opposite to each other), and as a result, the magnetic flux to be generated also becomes symmetric (the directions of the corresponding two magnetic flux lines are opposite to each other). If the magnetic flux is symmetric, the magnetic flux can be more effectively prevented from entering the substrate.

Furthermore, it is to be noted that the shape of the wiring part is not limited to that described in this embodiment of the present invention. The wiring part may have any shape if it can electrically connect the two winding parts. For example, the wiring part may have the shape of extending linearly from one terminal to the other. The length of the wiring part is preferably short in order to decrease its resistance and increase Q value of the spiral inductor. However, if the length of the wiring part is set to be short (for example, the wiring part may have the shape of extending linearly from one terminal to the other), the wiring part is opposed to at least one of the winding parts crossing it (them) in some cases. With respect to the spiral inductor 1 of this embodiment, if the wiring part 11 linearly extends from the terminal connected to the via hole 14 to the terminal connected to the via hole 15, it is opposed to the first and second winding parts 7 and 8 so as to cross askew the first and second straight-line parts thereof. In this case, since the current flows crossing the winding parts, which influences magnetic field, the condition of the magnetic flux penetrating the winding parts changes. Therefore, the wiring part is preferably arranged so as not to be opposed to the winding parts, or arranged along the winding directions of the winding parts when it is opposed to the winding parts.

In addition, although the wiring layer on which the wiring part is provided is positioned lower than the wiring layer on which the winding parts are provided in the spiral inductor according to this embodiment of the present invention, it may be positioned higher. Even in that case, the same advantage can be obtained as in the spiral inductor according to this embodiment.

Furthermore, an insulating layer may be further layered on the uppermost layer of the laminated structure in the spiral inductor according to this embodiment of the present invention.

(Second Embodiment)

Figure 2A:
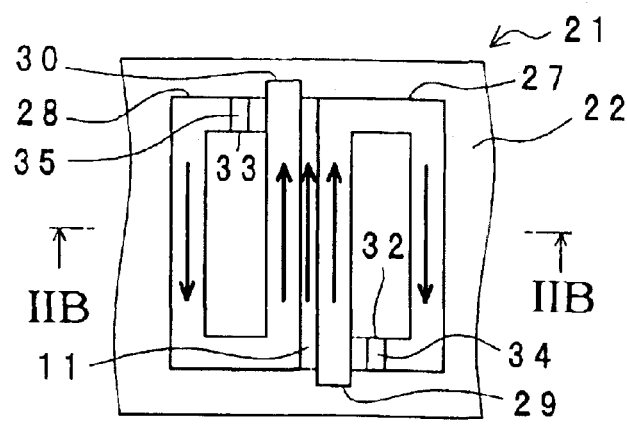
FIG. 2A is a plan view of a spiral inductor according to a second embodiment of the present invention.
Figure 2B:
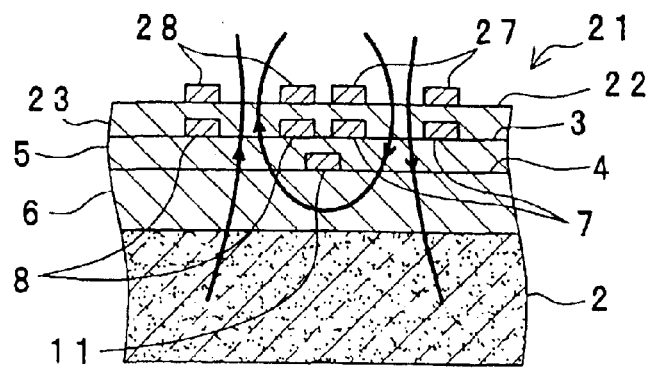
FIG. 2B is a sectional view of the spiral inductor and FIG. 2C is a schematic diagram of connections between wiring layers of the spiral inductor.

FIGS. 2A and 2B show a spiral inductor according to the second embodiment of the present invention. FIG. 2A is a plan view of the spiral inductor, and FIG. 2B is a sectional view taken along line IIB—IIB in FIG. 2A. The spiral inductor 21 according to this embodiment is different from the spiral inductor according to the first embodiment in that an insulating layer and a wiring layer are layered in this order on the uppermost layer of the laminated structure of the spiral inductor as shown in FIG. 2B. In addition, on this wiring layer, the same winding parts as those of the spiral inductor according to the first embodiment are arranged.

The uppermost layer of the laminated structure of the spiral inductor 21 is a wiring layer 22. The wiring layer 22 is positioned above the wiring layer 3 with an insulating layer 23 interposed between the wiring layers 22 and 3. FIG. 2A is a plan view of the wiring layer 22. Two winding parts 27 and 28 are provided on the wiring layer 22 of the spiral inductor 21. As can be seen in comparison of FIG. 1A, shapes and arrangements of the third and fourth winding parts 27 and 28 on the wiring layer 22 are similar to those of the first and second winding parts 7 and 8 on the wiring layer 3. The third winding part 27 is opposed to the first winding part 7 and the fourth winding part 28 is opposed to the second winding part 8.

Each of the third and fourth winding parts 27 and 28 is wound around in the shape of a rectangle from the outside to the inside only once. An outside terminal 29 of the third winding part 27 and an outside terminal 30 of the fourth winding part 28 are connected to outside devices or circuits for example, by extending the terminals through via holes. An inside terminal 32 of the third winding part 27 and an inside terminal 33 of the fourth winding part 28 are connected to via holes 34 and 35, respectively.

Figure 2C:
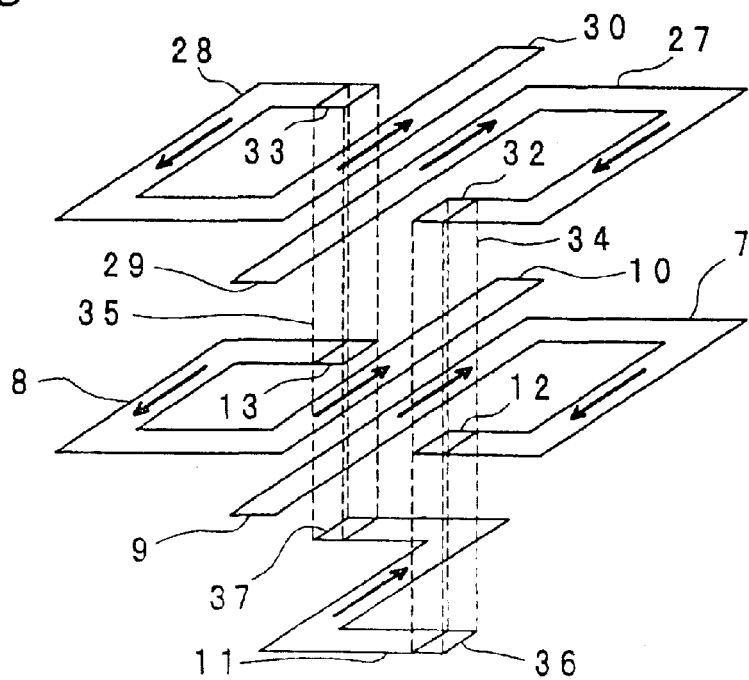

FIG. 2C shows connection of the two winding parts 27 and 28 on the wiring layer 22, the two winding parts 7 and 8 on the wiring layer 3 and the wiring part 11 on the wiring layer 4 among them. Hereinafter, an operation of the spiral inductor 21 will be described with reference to FIG. 2C. Here, the outside terminal 29 of the third winding part 27 is connected to the outside terminal 9 of the first winding part 7 and the outside terminal 30 of the fourth winding part 28 is connected to the outside terminal 10 of the second winding part 8. Furthermore, the inside terminal 32 of the third winding part 27 is connected to the inside terminal 12 of the first winding part 7 through the via hole 34 and the inside terminal 33 of the fourth winding part 28 is connected to the inside terminal 13 of the second winding part 8 through the via hole 35. More specifically, the two winding parts on the wiring layer 22 and the two winding parts on the wiring layer 3 are connected in parallel. In addition, one terminal 36 and the other 37 of the wiring part 11 provided on the wiring layer 4 are connected to the via holes 34 and 35, respectively. In this case, if a voltage is applied between the terminal 9 of the first winding part 7 and the terminal 10 of the second winding part 8 (that is, between the terminal 29 of the third winding part 27 and the terminal 30 of the fourth winding part 28), a current flows in the spiral inductor 21. Arrows shown in FIG. 2C show the directions of the current flowing in the spiral inductor 21. First, the description will be made with respect to the current flowing from the third winding part 27 to the fourth one 28 on the wiring layer 22. The current flows from the terminal 29 to the terminal 32 in the third winding part 27. Then, it reaches the wiring part 11 provided on the wiring layer 4 from the terminal 32 of the third winding part 27 through the via hole 34. After the current flows from the terminal 36 to the terminal 37 in the wiring part 11, it returns to the wiring layer 22 through the via hole 35. Then, the current flows from the terminal 33 to the terminal 30 in the fourth winding part 28. The direction of the current flowing in the third winding part 27 and that of the current flowing in the fourth winding part 28 are clockwise and counterclockwise, respectively, and opposite to each other.

Next, the description will be made with respect to the current flowing from the first winding part 7 to the second winding part 8 on the wiring layer 3. The current flows from the terminal 9 to the terminal 12 in the first winding part 7. Then, it reaches the wiring part 11 provided on the other wiring layer 4 from the terminal 12 of the first winding part 7 through the via hole 34. Then, the current returns to the wiring layer 3 through the via hole 35 after it flows from the terminal 36 to the terminal 37 in the wiring part 11, and flows from the terminal 13 to the terminal 10 in the second winding part 8. The direction of the current flowing in the first winding part 7 and that of the current flowing in the second winding part 8 are clockwise and counterclockwise, respectively, and opposite to each other. Moreover, the direction of the current flowing in the first winding part 7 is the same as that of the current flowing in the third winding part 27 and the direction of the current flowing in the second winding part 8 is the same as that of the current flowing in the fourth winding part 28.

Arrows shown in FIG. 2B show the directions of the magnetic flux generated when the currents flow in the directions shown by arrows in FIGS. 2A and 2C. The magnetic flux is generated in the direction of coming in the semiconductor substrate 2 by the currents flowing in the first and third winding parts 7 and 27. And the magnetic flux is generated in the direction of going out of the semiconductor substrate 2 by the currents flowing in the second and fourth winding parts 8 and 28. As shown in FIG. 2B, the magnetic flux penetrates the third winding part 27 and the first one 7 from top down (in the direction of coming in the substrate 2), passes under the wiring part 11 and penetrates the second winding part 8 and the fourth one 28 from bottom up (in the direction of going out of the substrate 2). Thus, the magnetic flux entering the substrate 2 can be reduced and eddy current can be prevented from generating in a region surrounded by the winding parts of the spiral inductor. As a result, energy loss of the spiral inductor 21 can be reduced.

According to the spiral inductor of this embodiment of the present invention, there are two wiring layers on each of which two winding parts are provided and each winding part in one wiring layer is connected in parallel to corresponding winding part provided on the other one. Therefore, a total resistance of the inductor can be reduced and Q value thereof can be increased as compared with the spiral inductor according to the first embodiment of the present invention.

Furthermore, although the wiring layer 22 on which the third and fourth winding parts 27 and 28 are provided is positioned above the wiring layer 3 on which the first and second winding parts are provided according to the spiral inductor of this embodiment, the wiring layer 22 may be positioned between the wiring layer 3 and the wiring layer 4 on which the wiring part 11 is provided. Also, the wiring layer 22 may be positioned under the wiring layer 3 and 4.

Moreover, although the third and fourth winding parts are wound around in the shape of a rectangle from the outside to the inside only once in the spiral inductor according to this embodiment of the present invention, it is to be noted that their shapes are not limited to be so. Those winding parts may be wound around in the shape of a circle, for example. In addition, the number of turns may be two or more. Furthermore, the third and fourth winding parts may have any shapes so long as the currents which flow around the third and fourth winding parts disposed adjacently to each other are in the opposite directions to each other, the current which flows around the third winding part is in the same direction as that flowing around the first winding part, and the current which flows around the fourth winding part is in the same direction as that flowing around the second winding part. Even in that case, the same advantage can be obtained as in the spiral inductor according to this embodiment.

Furthermore, although there are two wiring layers connected in parallel in the spiral inductor according to this embodiment of the present invention, there may be provided three or more wiring layers connected in parallel.

In addition, according to the spiral inductor of this embodiment of the present invention, the wiring layer on which the wiring part is provided is positioned under the two wiring layers on each of which the winding parts are provided. But it may be positioned above or between them. Even in those cases, the same advantage can be obtained as in the spiral inductor according to this embodiment.

Furthermore, an insulating layer may be further layered on the uppermost wiring layer of the laminated structure in the spiral inductor according to this embodiment.

Furthermore, according to the spiral inductor of this embodiment, two winding parts provided on the different wiring layers and connected in parallel have the same shapes and arranged in parallel in the direction vertical to the surface of the substrate, but they are not necessarily to be so. Even if they have different shapes and/or they are not arranged in the direction vertical to the surface of the substrate, it is a right so long as there is at least magnetic flux penetrating the two winding parts. However, when they have the same shapes and are arranged in parallel in the direction vertical to the surface of the substrate, the paths of the currents flowing them are symmetric (the directions of the currents are the same), and the magnetic flux lines penetrating the two winding parts coincide with each other. Thus, there is an advantage that the magnetic flux can be effectively prevented from entering the substrate.

Furthermore, the same advantage as in the spiral inductor according to the first embodiment of the present invention can be obtained in the spiral inductor according to this embodiment.

(Third Embodiment)

Figure 3A:
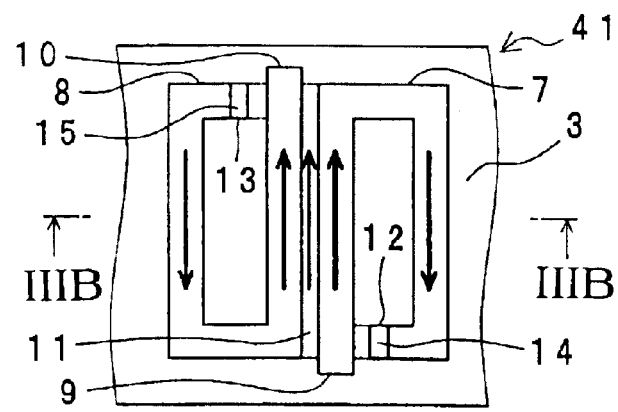
FIG. 3A is a plan view of a spiral inductor according to a third embodiment of the present invention.
Figure 3B:
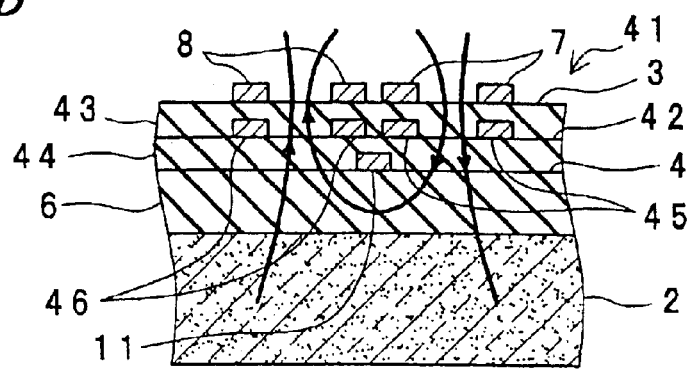
FIG. 3B is a sectional view of the spiral inductor and FIG. 3C is a schematic diagram of connections between wiring layers of the spiral inductor.
Figure 3C:
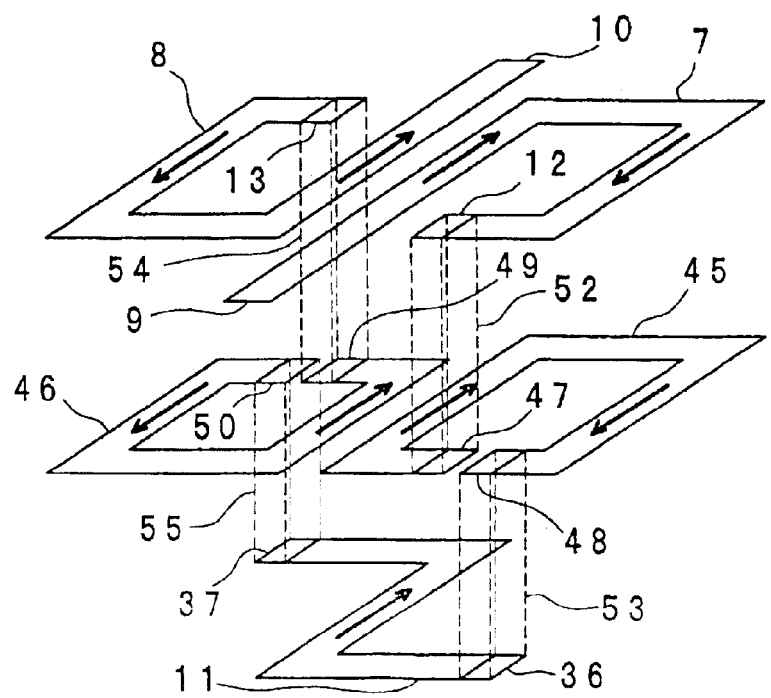

FIGS. 3A–3C show a spiral inductor according to the third embodiment of the present invention. FIG. 3A is a plan view of the spiral inductor, and FIG. 3B is a sectional view taken along break line IIIB—IIIB in FIG. 3A. The spiral inductor 41 according to this embodiment is different from that according to the first embodiment in that a wiring layer 42 is further provided between the wiring layers 3 and 4 in the laminated structure of the spiral inductor as shown in FIG. 3B. In addition, an insulating layers 43 is provided between the wiring layers 42 and 3, and an insulating layers 44 is provided between the wiring layers 42 and 4. On the wiring layer 42, there are provided two winding parts 45 and 46 having the shapes of rectangular open loops, different from those of the two winding parts on the wiring layer 3.

FIG. 3C shows connection of the two winding parts 7 and 8 on the wiring layer 3, the two winding parts 45 and 46 on the wiring layer 42 and the wiring part 11 on the wiring layer 4 among them. Hereinafter, an operation of the spiral inductor 41 will be described with reference to FIG. 3C. The inside terminal 12 of the first winding part 7 is connected to one terminal 47 of the first rectangular loop 45 through a via hole 52 and the other terminal 48 of the first rectangular loop 45 is connected to the one terminal 36 of the wiring layer 11 through a via hole 53. And, the inside terminal 13 of the second winding part 8 is connected to one terminal 49 of the second rectangular loop 46 through a via hole 54, and the other terminal 50 of the second rectangular loop 46 is connected to the other terminal 37 of the wiring part 11 through a via hole 55. Here, if a voltage is applied between the terminal 9 of the first winding part 7 and the terminal 10 of the second one 8, a current flows in the spiral inductor 41. Arrows shown in FIG. 3C show the directions of the current flowing in the spiral inductor 41. The current flows from the terminal 9 to the terminal 12 in the first winding part 7 on the wiring layer 3 and reaches the first rectangular loop 45 provided on the wiring layer 42 from the terminal 12 of the first winding part 7 through the via hole 52. Then, the current flows from the terminal 47 to the terminal 48 in the first rectangular loop 45 and reaches the wiring part 11 on the wiring layer 4 from the terminal 48 of the first rectangular loop 45 through the via hole 53. Then, the current flows from the terminal 36 to the terminal 37 in the wiring part 11 and reaches the second rectangular loop 46 from the terminal 37 of the wiring part 11 through the via hole 55. Then, the current flows from the terminal 50 to the terminal 49 in the second rectangular loop 46 and reaches the second winding part 8 from the terminal 49 of the second rectangular loop 46 through the via hole 54. Then, the current flows from the terminal 13 to the terminal 10 in the second winding The direction of the current flowing in the first winding part 7 and that of the current flowing in the second winding part 8 are clockwise and counterclockwise, respectively, and opposite to each other. The direction of the current flowing in the first rectangular loop 45 and that of the current flowing in the second rectangular loop 46 are clockwise and counterclockwise, respectively, and opposite to each other. Therefore, the direction of the current flowing in the first rectangular loop 45 is the same as that of the current flowing in the first winding part 7 and the direction of the current flowing in the second rectangular loop 46 is the same as that of the current flowing in the second winding part 8.

Arrows shown in FIG. 3B show the directions of the magnetic flux generated by the current flowing in the directions shown by arrows in FIGS. 3A and 3C. The magnetic flux is generated in the direction of coming in the semiconductor substrate 2 by the currents flowing in the first winding part 7 and the first rectangular loop 45. And the magnetic flux is generated in the direction of going out of the semiconductor substrate 2 by the currents flowing in the second winding part 8 and the second rectangular loop 46. As shown in FIG. 3B, the magnetic flux penetrates the first winding part 7 and the first rectangular loop 45 from top down (in the direction of coming in the substrate 2), passes under the wiring part 11 and penetrates the second rectangular loop 46 and the second winding part 8 from bottom up (in the direction of going out of the substrate). Thus, the magnetic flux entering the substrate 2 can be reduced and eddy current can be prevented from generating in a region surrounded by the winding parts of the spiral inductor. As a result, energy loss of the spiral inductor 41 can be reduced.

According to the spiral inductor of this embodiment of the present invention, the wound wirings are connected in series between the first winding part and the wiring part and between the second winding part and the wiring part. Thus, as compared with the spiral inductor according to the first embodiment, the number of turns of the spiral inductor is increased and self-inductance (L) value thereof can be increased. As a result, the Q value thereof can be increased.

In addition, according to the spiral inductor of this embodiment, each wound wiring is in the shape of a rectangular open loop. But, it may be in the shape of a spiral. The wound wiring may have any shape so long as one terminal of the wound wiring is connected to one terminal of the corresponding winding part, the other one thereof is connected to one terminal of the wiring part, and the direction of the current flowing in the wound wiring is the same as that of the current flowing in the corresponding winding part.

Furthermore, although the two wound wiring loops each of which is connected in series between the winding part and the wiring part have the same shapes in the spiral inductor according to this embodiment, it is to be noted that the shapes are not limited to them. Even if they have different shapes, the magnetic flux can be prevented from entering the substrate. However, if they have the same shapes, the paths of the currents flowing around them become symmetric (the directions of the currents are opposite to each other), so that the magnetic flux generated also become symmetric (the directions of the corresponding two magnetic flux lines are opposite to each other). If the magnetic flux is symmetric, the magnetic flux can be more effectively prevented from entering the substrate.

Furthermore, although each wound wiring loop and each winding part are aligned in the direction vertical to the surface of the substrate according to the spiral inductor of this embodiment, they are not necessarily to be so. It is all right so long as there is at least magnetic flux penetrating the winding part and the wound wiring loop. However, when they are disposed in parallel in the direction vertical to the surface of the substrate, the paths of the currents flowing through them are symmetric and the magnetic flux lines penetrating them coincide with each other. Thus, there is an advantage that the magnetic flux can be effectively prevented from entering the substrate.

In addition, according to the spiral inductor of this embodiment, the wiring layer on which the wiring part is provided is positioned under the two wiring layers on which the winding parts and the wound wiring loops are provided. But the wiring layer on which the wiring part is provided may be positioned above them. In that case, the wiring layer on which the wound wiring loops is provided is positioned between the wiring layer on which the winding parts are provided and the wiring layer on which the wiring part is provided. Even in that case, the same advantage as in the spiral inductor of this embodiment can be obtained.

Furthermore, an insulating layer may be further layered on the uppermost layer of the laminated structure in the spiral inductor according to this embodiment.

Furthermore, the same advantage as in the spiral inductor according to the first embodiment can be obtained in the spiral inductor according to this embodiment.

(Fourth Embodiment)

Figure 4A:
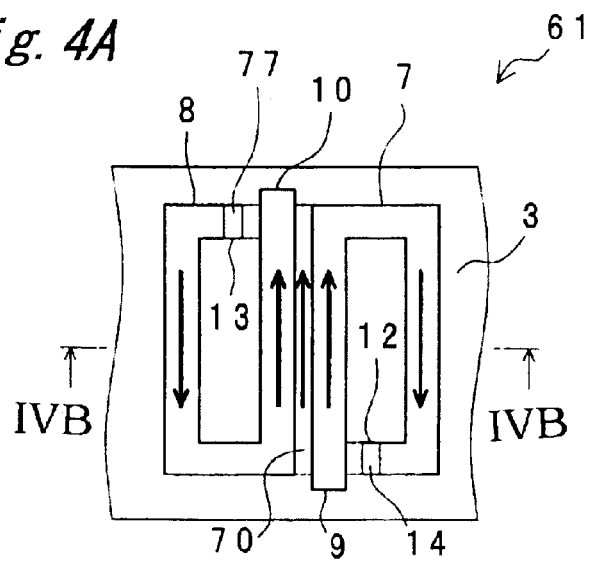
FIG. 4A is a plan view of a spiral inductor according to a fourth embodiment of the present invention.
Figure 4B:
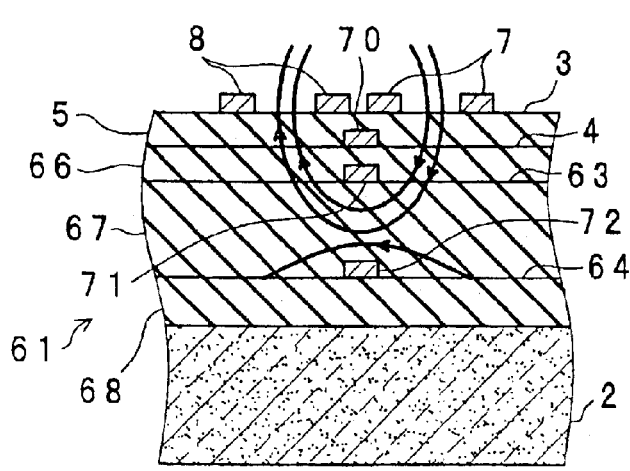
FIG. 4B is a sectional view of the spiral inductor and FIG. 4C is a schematic view of connections between wiring layers of the spiral inductor.
Figure 4C:
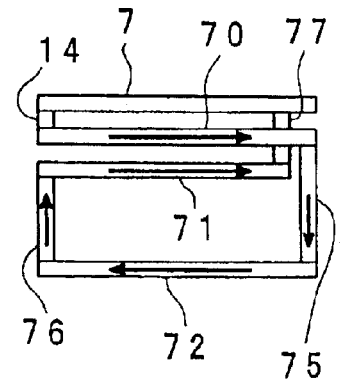

FIGS. 4A–4C show a spiral inductor according to the fourth embodiment of the present invention. FIG. 4A is a plan view of the spiral inductor, and FIG. 4B is a sectional view taken along line IVB—IVB in FIG. 4A. A spiral inductor 61 according to this embodiment is different from the spiral inductor according to the first embodiment in that wiring layers 63 and 64 are further provided between the wiring layer 4 and the semiconductor substrate 2 in the laminated structure of the spiral inductor as shown in FIG. 4B. In addition, insulating layers 66, 67 and 68 are provided between the wiring layer 4 and the wiring layer 63, between the wiring layers 63 and 64 and between the wiring layer 64 and the semiconductor substrate 2, respectively. Wiring parts 70, 71 and 72 each of which has a single path from one terminal to the other are provided on the wiring layers 4, 63 and 64, respectively.

Each of the wiring parts 70, 71 and 72 has straight-line part. First, the wiring part 70 will be described. The straight-line part of the wiring part 70 is positioned on the wiring layer 4 in parallel with the first and second straight-line parts and opposed to the region between the first and second straight-line parts on the wiring layer 3. As for the wiring part 70, a portion connecting one terminal to a part other than the straight-line part is arranged so as to be opposed to the first winding parts 7 along the winding direction, and the portion connecting the other to a part other than the straight-line part is arranged so as to be opposed to the second winding part 8 along the winding direction. As a result, the wiring part 70 is opposed to the first and second winding parts 7 and 8 so as not to cross them. The shape of the wiring part 72 is the same as that of the, wiring part 70 in the spiral inductor 61 according to this embodiment. In addition, as shown in FIG. 4B, the wiring parts 70, 71 and 72 are arranged in parallel in the direction vertical to the surface of the substrate 2.

FIG. 4C shows connection of the wiring parts 70, 71 and 72 among them. The terminal 12 of the first winding part 7 provided on the wiring layer 3 is connected to one end (positioned so as to be opposed to the terminal 12) of the wiring part 70 provided on the wiring layer 4 by the via hole 14 provided in the insulating layer 5. The other end of the wiring part 70 is connected to one end (positioned so as to be opposed to the other end of the first wiring part 70) of the wiring part 72 provided on the wiring layer 64 through a via hole 75 which penetrates the insulating layer 66, the wiring layer 63 and the insulating layer 67. The other end of the wiring part 72 is connected to one end (positioned so as to be opposed to the other end of the wiring part 72) of the wiring part 71 provided on the wiring layer 63 through a via hole 76 provided in the insulating layer 67. The other end of the wiring part 71 is connected to the terminal 13 (positioned so as to be opposed to the other end of the wiring part 71) of the second winding part 8 through a via hole 77 which penetrates the insulating layer 66, the wiring layer 4 and the insulating layer 5.

According to the spiral inductor 61 of this embodiment, the via holes 77 and 75 are provided so as not to be connected to each other. Therefore, the terminal of the wiring part 70 connected to the via hole 75 is positioned so as not to be opposed to the terminal of the wiring part 71 connected to the via hole 77. In this respect, the portion connecting the terminal connected to the via hole 75 and the straight-line part of the wiring part 70 has the shape different from the portion connecting the terminal connected to the via hole 77 and the straight-line part of the wiring part 71.

In the case of the connections as described above, the straight-line parts of the wiring parts 70, 71 and 72 are arranged in parallel on the same plane in the direction vertical to the surface of the semiconductor substrate 2. The plane is vertical to the plane (wiring layer 3) on which the first and second winding parts 7 and 8 are provided.

Arrows shown in FIGS. 4A and 4C show the directions of the current flowing in the spiral inductor 61. The current flows from the terminal 9 to the terminal 12 in the first winding part 7 on the wiring layer 3 and reaches. the wiring part 70 on the wiring layer 4 from the terminal 12 of the first winding part 7 through the via hole 14. Then, the current flows through the wiring part 70 and reaches the wiring part 72 on the wiring layer 64 through the via hole 75. Then, the current flows through the wiring part 72 and reaches the wiring part 71 on the wiring layer 63 through the via hole 76. Then, the current flows through the wiring part 71 and reaches the second winding part 8 on the wiring layer 3 through the via hole 77. Then, the current flows from the terminal 13 to the terminal 10 in the second winding part 8.

Arrows shown in FIG. 4B show the directions of the magnetic flux generated by the current flowing in the directions shown by arrows in FIGS. 4A and 4C. The magnetic flux generated by the current flowing in the first winding part 7 is in the direction of coming in the semiconductor substrate 2 and the magnetic flux generated by the current flowing in the second winding part 8 is in the direction of going out of the semiconductor substrate 2. As shown in FIG. 4B, the magnetic flux penetrates the first winding part 7 from top down (in the direction, of coming in the substrate 2), penetrates the plane formed by the straight-line parts of the wiring parts 70, 71 and 72 in the direction vertical to the plane between the wiring parts 71 and 72 and penetrates the second winding part 8 from bottom up (in the direction of going out of the substrate). Thus, the magnetic flux entering the substrate 2 can be reduced and eddy current can be prevented from generating in a region surrounded by the winding parts of the spiral inductor. As a result, energy loss of the spiral inductor 61 can be reduced.

According to the spiral inductor 61 of this embodiment of the present invention, the magnetic flux can be further prevented from entering the semiconductor substrate 2 as compared with the spiral inductor 1 according to the first embodiment. As a result, energy loss of the spiral inductor can be further reduced.

In addition, although the three wiring parts have the same shapes in the spiral inductor according to this embodiment, it is to be noted that they are not limited to be so. Furthermore, although each of the three wiring parts has the straight-line part and the straight-line parts are arranged in parallel in the direction vertical to the surface of the substrate, it is to be noted that they are not limited to be so.

Furthermore, although the plane formed by the straight-line parts of the three wiring parts is vertical to the plane on which the winding parts are provided, it is to be noted that they are not limited to be so. It is all right so long as the magnetic flux penetrating one winding part in one direction is encouraged to penetrate the other one in the opposite direction because of the magnetic field induced by the current flowing in the three wiring parts and via holes connecting them, so that the magnetic flux generated by the winding parts is prevented from entering the substrate. However, if each of the three wiring parts has the straight-line part and the straight-line parts are arranged in parallel in the direction vertical to the surface of the substrate, the magnetic flux can be effectively prevented from entering the substrate. Preferably, the straight line connecting the center of the winding of one winding part to the center of the winding of the other one is vertical to the plane formed by the straight-line parts of the three wiring parts. At this time, the path of the magnetic flux penetrating the one winding part from top down and penetrating the other winding part from bottom up coincides with the path of the magnetic flux generated by the current flowing through the three wiring parts. As a result, the magnetic flux is further prevented from entering the substrate.

Furthermore, an insulating layer may be further layered on the uppermost wiring layer of the laminated structure in the spiral inductor according to this embodiment.

Furthermore, the same advantage as in the spiral inductor 1 according to the first embodiment can be obtained in the spiral inductor according to this embodiment of the present invention.

(Fifth Embodiment)

Figure 5A:
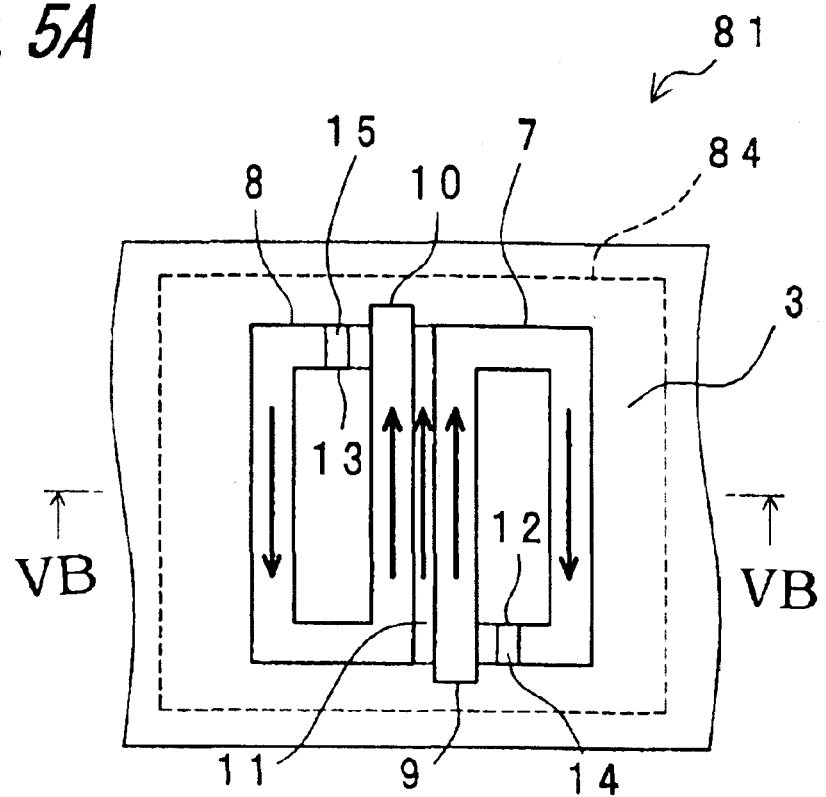
FIG. 5A is a plan view of a spiral inductor according to a fifth embodiment of the present invention and FIG. 5B is a sectional view of the spiral inductor.
Figure 5B:
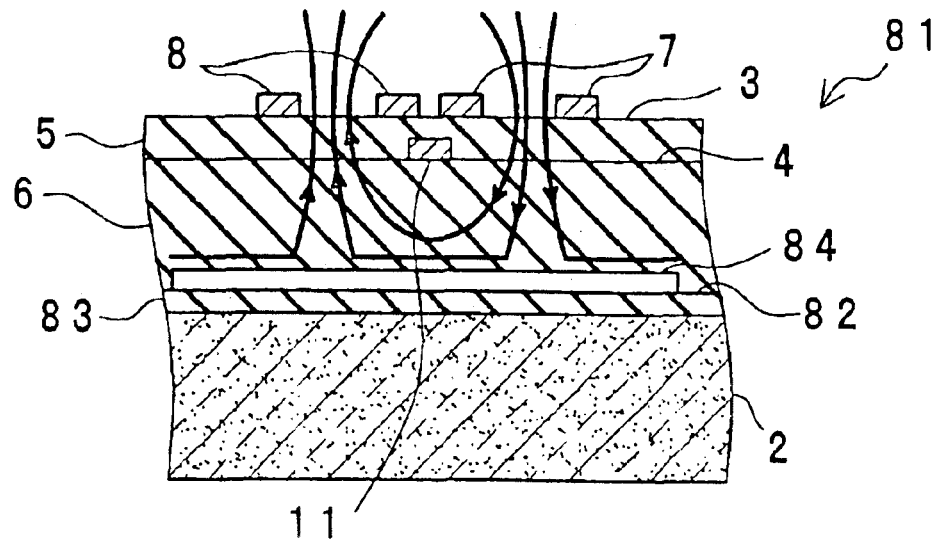

FIGS. 5A and 5B show a spiral inductor according to the fifth embodiment of the present invention. FIG. 5A is a plan view of the spiral inductor, and FIG. 5B is a sectional view taken along line VA—VA in FIG. 5A. A spiral inductor 81 according to this embodiment is different from the spiral inductor according to the first embodiment in that a wiring layer 82 is further provided between the wiring layer 4 and the semiconductor substrate 2 and an electromagnetic shielding plate 84 made of a superconductor is disposed on the wiring layer 82. The insulating layer 6 is provided between the wiring layers 4 and 82. In addition, an insulating layer 83 is provided between the wiring layer 82 and the semiconductor substrate 2.

Arrows shown in FIG. 5B show the directions of the magnetic flux generated by the current flowing in the directions shown by arrows in FIG. 5A. The magnetic flux generated by the current flowing in the first winding part 7 is in the direction of coming in the semiconductor substrate 2 and the magnetic flux generated by the current flowing in the second winding part 8 is in the direction of going out of the semiconductor substrate 2. As shown in FIG. 5B, the magnetic flux which penetrates the first winding part 7 from top down (in the direction of coming in the substrate 2) is repelled by the electromagnetic shielding plate 84 made of the superconductor. A part of such magnetic flux passes under the wiring part 11 and penetrates the second winding part 8 from bottom up (in the direction of going out of the substrate). Another part of such magnetic flux exists along the surface of the electromagnetic shielding plate 84 and does not enter the semiconductor substrate 2.

According to the spiral inductor 81 of this embodiment, the superconductor which repels the magnetic field is disposed between the substrate and the nearest wiring layer from the substrate. Thus, the magnetic flux entering the substrate 2 can be reduced and eddy current can be prevented from generating in a region surrounded by the winding parts of the spiral inductor. As a result, energy loss of the spiral inductor can be reduced.

Furthermore, an insulating layer may be further layered on the uppermost wiring layer of the laminated structure in the spiral inductor according to this embodiment.

Furthermore, the same advantage as in the spiral inductor 1 according to the first embodiment can be obtained in the spiral inductor according to this embodiment of the present invention.

Figure 6A:
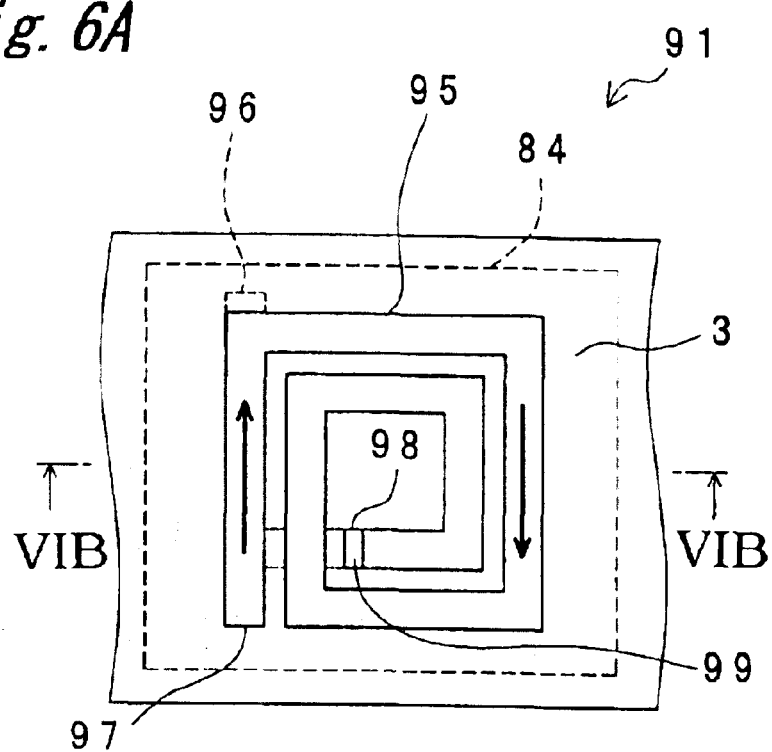
FIG. 6A is a plan view of another spiral inductor according to a fifth embodiment of the present invention and FIG. 6B is a sectional view of the spiral inductor.
Figure 6B:
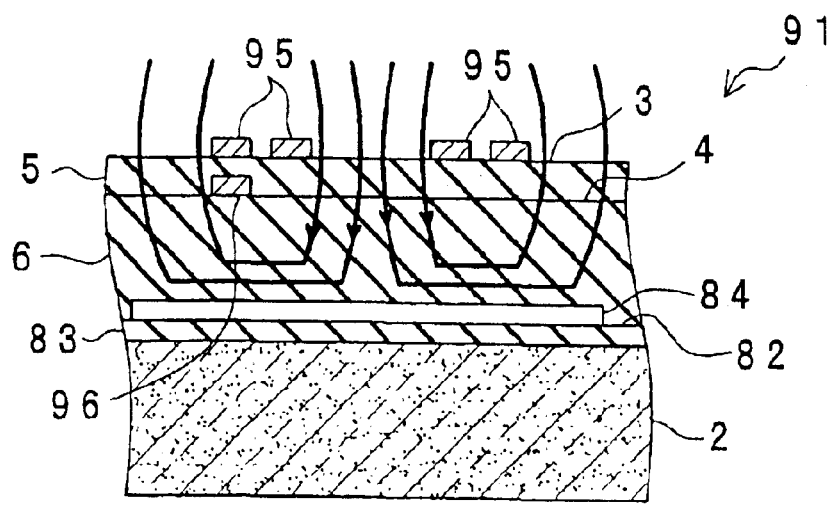

In addition, the structure in which the superconductor which repels the magnetic field is disposed between the substrate and the nearest wiring layer from the substrate can be applied to a conventional spiral inductor. Even if it is applied to the conventional spiral inductor, there can be provided the same advantage that the magnetic flux which enters the substrate can be reduced and energy loss of the spiral inductor can be reduced. FIGS. 6A and 6B show another spiral inductor according to this embodiment, in which the superconductor which repels the magnetic field is provided in the conventional spiral inductor wound around spirally on the same plane. FIG. 6A is a plan view of the spiral inductor and FIG. 6B is a sectional view taken along line VIA—VIA in FIG. 6A.

As shown in FIG. 6A, a winding 95 wound around spirally is provided on the wiring layer 3. An outside terminal 97 of the spiral winding 95 is connected to an outside device or circuit, for example, by extending the terminal through a via hole. An inside terminal 98 of the winding 95 is electrically connected to an electrode 96 provided on another wiring layer 4 through a via hole 99. When a voltage is applied between the outside terminal 97 and the inside terminal 98, a current flows in the winding 95.

Arrows shown in FIG. 6B show the directions of the magnetic flux generated by the current flowing in the directions shown by arrows in FIG. 6A in the winding 95. The magnetic flux is generated in the direction of penetrating the central portion of the winding 95 by the current flowing therein. As shown in FIG. 6B, the magnetic flux penetrating the winding 95 from top down (in the direction of entering the substrate 2) is repelled by the electromagnetic shielding plate 84 made of the superconductor. Such magnetic flux goes along the surface of the electromagnetic shielding plate 84 and moves up outside the winding 95 and then, gets out of the spiral inductor 91. Thus, the magnetic flux entering the substrate can be reduced and eddy current can be prevented from generating in a region surrounded by the winding parts of the spiral inductor. As a result, energy loss of the spiral inductor can be reduced.

(Sixth Embodiment)

Figure 7A:
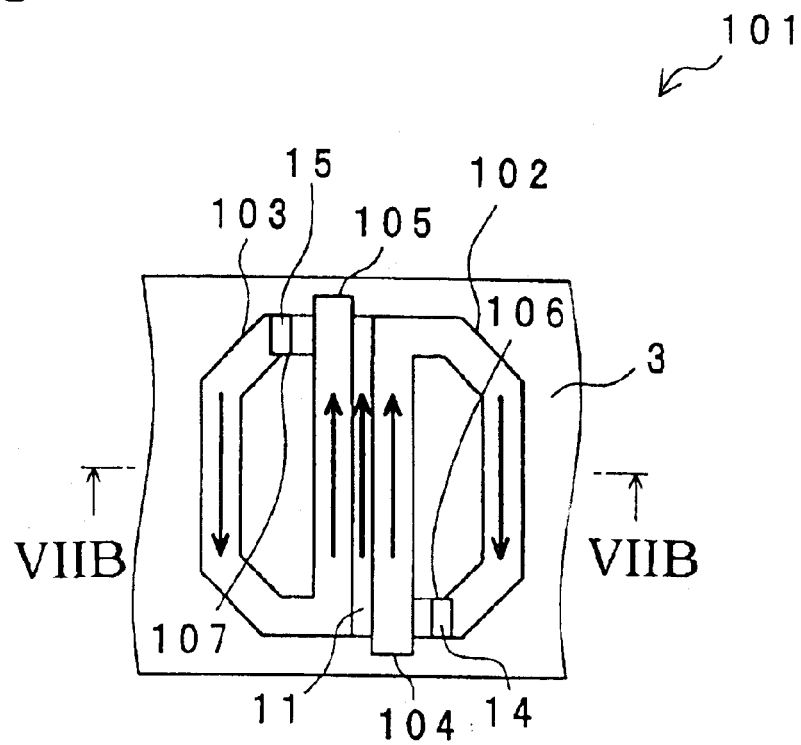
FIG. 7A is a plan view of a spiral inductor according to a sixth embodiment of the present invention and FIG. 7B is a sectional view of the spiral inductor.
Figure 7B:
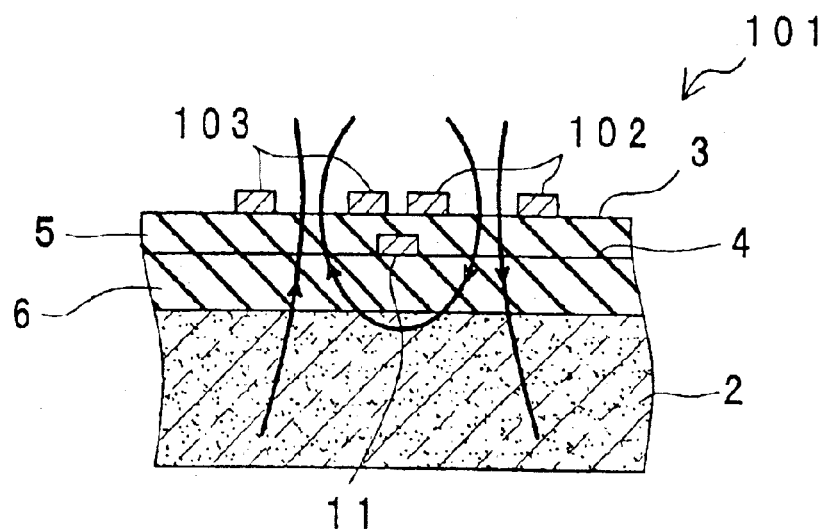

FIGS. 7A and 7B a spiral inductor according to the sixth embodiment of the present invention. FIG. 7A is a plan view of the spiral inductor, and FIG. 7B is a sectional view taken along line VIIA—VIIA in FIG. 7A. A spiral inductor 101 according to this embodiment is different from the spiral inductor according to the first embodiment in that two winding parts 102 and 103 provided on the wiring layer 3 have shapes such that the corners of the winding parts 7 and 8 wound in the shape of a rectangle are removed.

According to FIG. 7A, an outside terminal 104 of the first winding part 102 and an outside terminal 105 of the second winding part 103 are connected to outside devices or circuits, for example, by extending the terminals through via holes. When a voltage is applied between the terminal 104 of the first winding part 102 and the terminal 105 of the second winding part 103, the current flows in the spiral inductor 101. Arrows in FIG. 7A show the directions of the current flowing in the spiral inductor 101 when a current flows from the terminal 104 to the terminal 105. The current flows from the outside terminal 104 to an inside terminal 106 in the first winding part 102 and reaches the wiring part 11 on another wiring layer 4 through the via hole 14. After the current flows through the wiring part 11, it returns to the wiring layer 3 through the via hole 15 and flows from an inside terminal 107 to the outside terminal 105 in the second winding part 103. As shown in FIG. 7A, the direction of the current flowing in the first winding part 102 and that of the current flowing in the second winding part 103 are clockwise and counterclockwise, respectively, and opposite to each other. Arrows in FIG. 7B show the directions of the magnetic flux generated by the current flowing in the directions shown by arrows in FIG. 7A.

According to the spiral inductor of this embodiment, since the corners in the winding parts wound around in the shape of a rectangle are removed by 45 degrees, for example, current convergence at the portions where the corners are removed can be reduced to increase Q value of the inductor.

Furthermore, if the winding part are wound around in the shape of a polygonal (with more angles than a quadrangle) or a circle, a current is prevented from concentrating locally, so that the Q value of the inductor can be increased.

Furthermore, an insulating layer may be further layered on the uppermost wiring layer of the laminated structure in the spiral inductor according to this embodiment.

Furthermore, the same advantage as in the spiral inductor according to the first embodiment can be obtained in the spiral inductor according to this embodiment of the present invention.

(Seventh Embodiment)

The spiral inductors described in the first to sixth embodiments can be applied to a monolithic microwave integrated circuit (MMIC) which is used for mobile communication or satellite communication or the like. This is a microwave integrated circuit on which an active device (a FET, a HEMT or the like) and a passive device (a transmission line, a capacitor, an inductor or the like) are provided together on semiconductor substrate. If the inductor according to the present invention is used in the MMIC, a magnetic flux generated by a current flowing in the inductor can be prevented from entering the semiconductor substrate. As a result, energy loss in the inductor of the MMIC can be reduced In addition, according to the inductor of the present invention, the magnetic flux can be prevented from entering the semiconductor substrate while an occupied area is kept small as compared with a conventional spiral inductor.

It will be obvious to those having skill in the art that many changes may be make in the above-described details of the preferred embodiments of the present invention. The scope of the present invention, therefore, should be determined by the following claims.

What is claimed is:

1. An inductor comprising:
   a semiconductor substrate;
   a laminated structure including an insulating layer and a wiring layer layered alternately on said semiconductor substrate, wherein
      said laminated structure comprises a first layer structure, a second layer structure, and a first insulating layer interposed between the first and second layer structures,
      said first layer structure comprises a first wiring layer on which a first winding part and a second winding part in the same plane and disposed adjacent each other are wound,
      said second layer structure comprises a second wiring layer on which a first wiring part is disposed, having a single path from one terminal, and;
      said first insulating layer comprises a first via hole and a second via hole connecting said first wiring layer to said second wiring layer, a first terminal of said first winding part is connected to a second terminal of said first wiring part through said first via hole, and a third terminal of said second winding part is connected to a fourth terminal of said first wiring part through said second via hole, and
   a first current flows through said first winding part from a fifth terminal to said first terminal, and a second current flows through said second winding part from said third terminal to a sixth terminal, with directions of the first and second currents being opposite each other when a voltage is applied across said fifth terminal of said first winding part and said sixth terminal of said second winding part.

2. The inductor according to claim 1, wherein said first wiring part consists of at least one of a first portion, which is opposed to a region between said first and second winding parts, and a second portion, which extends along winding directions of said first and second winding parts, and said first wiring part is symmetrical with respect to a central point.

3. The inductor according to claim 1, wherein
   said first layer structure further comprises a third wiring layer on an opposite side of said second wiring layer with respect to said first wiring layer, and a second insulating layer interposed between said first and third wiring layers,
   said second insulating layer comprises a third via hole and a fourth via hole connecting said first wiring layer to said third wiring layer,
   a third winding part and a fourth winding part in the same plane are disposed adjacent to each other on said third wiring layer and wound,
   said third winding part comprises a seventh terminal electrically connected to said first terminal of said first winding part through said third via hole and a eighth terminal connected to said fifth terminal of said first winding part,
   said fourth winding part comprises a ninth terminal electrically connected to said third terminal of said second winding part through said fourth via hole and a tenth terminal connected to said sixth terminal of said second winding part, and
   a third current flows through said third winding part from said eighth terminal to said seventh terminal and a fourth current flows through said fourth winding part from said ninth terminal to said tenth terminal, with directions of the third current flowing through said third winding part being the same as the direction of the first current, and the direction of the fourth current flowing around said fourth winding part being the same as the direction of the second current when the voltage is applied across said fifth terminal of said first winding part and said sixth terminal of said second winding part.

4. The inductor according to claim 1, wherein
   said first layer structure further comprises a third wiring layer on the same side of said second wiring layer as said first wiring layer, and a second insulating layer interposed between said first and third wiring layers,
   said first insulating layer is interposed between said second and third wiring layers and comprises first and second via holes connecting said second wiring layer to said third wiring layer, said second insulating layer comprises a third via hole and a fourth via hole connecting said first wiring layer to said third wiring layer, a third winding part and a fourth winding part in the same plane are disposed adjacent to each other on said third wiring layer and wound, said first terminal of said first winding part is connected to a seventh terminal of said third winding part through said third via hole, a eighth terminal of said third winding part is connected to said second terminal of said first wiring part through said first via hole, said fourth terminal of said first wiring part is connected to a ninth terminal of said fourth winding part through said second via hole, and a tenth terminal of said fourth winding part is connected to said third terminal of said second winding part through said fourth via hole, and a third current flows through said third winding part from said seventh terminal to said eighth terminal, and a fourth current flows through said fourth winding part from said ninth terminal to said tenth terminal, the direction of the third current being the same as the direction of first current, and the direction of to fourth current being the same as the direction of the second current when the voltage is applied across said fifth terminal of said first winding part and said sixth terminal of said second winding part.

5. The inductor according to claim 1, wherein said second layer structure is positioned between said first layer structure and said semiconductor substrate, said second layer structure further comprises a third wiring layer positioned between said second wiring layer and said semiconductor substrate, a fourth wiring layer positioned between said third wiring layer and said semiconductor substrate, a second insulating layer interposed between said second and third wiring layers, and a third insulating layer interposed between said third and fourth wiring layers, said third wiring layer comprises a second wiring part having a single path from one terminal of said second wiring part to another terminal of said second wiring part and said fourth wiring layer comprises a third wiring part having a single path from one terminal of said third wiring part to another terminal of said third wiring part, said second layer structure comprises a third via hole penetrating said second insulating layer, said third wiring layer, and said third insulating layer connecting said second wiring layer to said fourth wiring layer, a fourth via hole penetrating said third insulating layer and a fifth via hole penetrating said second wiring layer and said second insulating layer, said second via hole and said fifth via hole form a sixth via hole connecting said first wiring layer to said third wiring layer, said first, second, and third wiring parts have straight-line parts parallel to one another and arranged in a direction perpendicular to said semiconductor substrate, said fourth terminal of said first wiring part is connected to a seventh terminal of said third wiring part through said third via hole, an eighth terminal of said third wiring part is connected to a ninth terminal of said second wiring part through said fourth via hole, and a tenth terminal of said second wiring part is connected to said third terminal of said second winding part though said sixth via hole, and a straight line connecting a center of said first winding part to a center of said second winding part is perpendicular to a plane formed by said straight-line parts of said first, second, and third wiring parts.

6. The inductor according to claim 5, wherein each of said straight-line parts of said first, second, and third wiring parts is located opposite a region between said first and second winding parts.

7. The inductor according to claim 1, wherein said second layer structure further comprises a superconductor electromagnetic shielding plate between said semiconductor substrate and the wiring layer nearest said semiconductor substrate.

8. The inductor according to claim 1, wherein each of said first and second winding parts is wound in a circle.

9. The inductor according to claim 1, wherein each of said first and second winding parts is wound in a polygonal shape having more than four corners.

* * * * *